United States Patent [19]

Dvorak, Jr. et al.

[11] Patent Number: 5,334,043

[45] Date of Patent: Aug. 2, 1994

[54] TEST FIXTURE FOR ELECTRONIC COMPONENTS

[75] Inventors: George J. Dvorak, Jr., Holden; Lee M. Wolfe, Milford, both of Mass.

[73] Assignee: Digital Equipment Corporation, Maynard, Mass.

[21] Appl. No.: 967,595

[22] Filed: Oct. 28, 1992

[51] Int. Cl.$^5$ .................. H01R 13/627; H01R 13/00
[52] U.S. Cl. ................................ 439/482; 439/364
[58] Field of Search ............... 439/359, 364, 482; 324/158 F

[56] References Cited

U.S. PATENT DOCUMENTS

| | | | |
|---|---|---|---|
| 1,897,954 | 2/1933 | D'Olier, Jr. | 439/364 |
| 4,023,102 | 5/1977 | Barrow et al. | 324/158 F |
| 4,842,526 | 6/1989 | Stukalin et al. | 439/42 |
| 5,100,336 | 3/1992 | Burgess et al. | 439/364 |

OTHER PUBLICATIONS

Garland, J. W.; "Electrical Plug Jack Housing", IBM Tech. Discl. Bulletin; vol. 9, No. 10, Mar. 1967, p. 1280.

Primary Examiner—P. W. Echols
Attorney, Agent, or Firm—Kenneth F. Kozik; A. Sidney Johnston

[57] ABSTRACT

A test fixture for facilitating connection between the test leads of a diagnostic device and a pin grid array, dispersion via, or other multi-leaded electronic components mounted on a printed circuit boards. A base is provided of a nonconductive material having holes for spring loaded test pins. In the center of the fixture is a threaded rod which attaches the fixture onto a small threaded stud attached to the printed circuit board. The screw attachment is designed so that the fixture first screws onto the metal stud with light finger pressure. A nested screw arrangement utilizing a left hand threaded part then presses the fixture against the printed circuit board, compressing the test pins for good contact. The portion of the mechanism used for pressing the fixture against the printed circuit board is isolated by a bearing from the part that attaches to the threaded stud so that it exerts no torque on the threaded stud in the printed circuit board, thus preventing possible damage or wear on the stud, and misalignment of the fixture in relation to the component leads or dispersion vias.

15 Claims, 3 Drawing Sheets

TEST FIXTURE FOR ELECTRONIC COMPONENTS

BACKGROUND OF THE INVENTION

The present invention relates to the field of electronic test equipment, and more particularly to the field of test fixtures employed in testing electronic components.

As is known in the art, electronic equipment such as computers, video equipment, test equipment and the like are generally comprised of one or more so called printed circuit boards or modules. Printed circuit boards typically have etched conductive patterns and are used to support and interconnect several electrical components including passive devices and in particular integrated circuits. Typically such components have so called external leads or pins used to connect the component to operative positions of the printed circuit board.

As it is also known, during the manufacture of the electronic equipment, it is often necessary to access an external lead or pin of an electronic component mounted on the printed circuit board (PCB) to find and correct flaws in manufacture or design of the board. Generally, it is necessary to provide access to the electronic component on a lead-by-lead basis in order to probe individual connections of the integrated circuits to the printed circuit board. As it is further known, very large scale integrated circuits are often used in electronic equipment and in general have a very large number of electrical leads or pins making access to VLSI (very large scale integration) devices difficult.

One approach, for example, is to solder a "pigtail" on each lead, allowing the attachment of test leads on any pin on the device. Alternatively, a clip pigtail can be employed to make temporary connections to certain types of devices. Such a fixture is designed to make contact with the leads with a particular type of device, and the fixture physically attaches to the device, held in place by spring pressure.

Another approach to this problem is the use of a "vacuum table" fixture which is designed to allow connection to each pin location on the electronic component supported on the printed circuit board. Such a device is secured to the printed circuit board by developing a vacuum in a space between the printed circuit board and a base portion of the fixture. The fixture provides a connection point on each pin located on the board allowing technicians and engineers to gain access to each component on the printed circuit board.

Still another approach has been to use a test fixture including a resilient body which has an attached resilient seal separated by stiffeners. In operation, this type of fixture is aligned with a pin grid array or a dispersion via pattern protruding through the printed circuit board on the side of the printed circuit board opposite the component. In this approach, a vacuum system provides a pressure differential into a well which forces the fixture on to the printed circuit board and causes the test connectors to make contact with the component pins or dispersion vias on the printed circuit board. This approach uses a vacuum type of attachment, which, if not strong enough to hold the test fixture or pod to the printed circuit board, causes a great deal of engineer frustration, inefficiency, and damage when the fixture falls off the printed circuit boards being tested. In addition, this vacuum design needs a relatively wide region disposed about the periphery of the bottom of the fixture base for a vacuum gasket. This wide region precludes adjacent test fixtures from being spaced close together. Therefore, this approach sometimes requires undesirable changes in placement of components on the printed circuit board to allow space for a vacuum gasket seal type of test fixture. Moreover, this type of fixture also requires a vacuum pump or other source of vacuum. This further adds to the cost associated with this type of test fixture and makes use of this type of test fixture impractical if testing is performed at a customer site.

SUMMARY OF THE INVENTION

In accordance with the present invention, a fixture for connecting test pins to an electronic component board, includes a base having a central bore, a threaded fitting attached to the base and having a portion disposed through the center bore, a cylindrical body having a central bore therethrough and having an internal threaded portion at its lower end mated to the threaded portion of the fitting, a cylindrical rod disposed through the cylindrical body, and means, disposed through the central bore of the cylindrical body, for providing rotational movement isolation between the cylindrical body and the cylindrical rod. With such an arrangement, a fixture for coupling cable leading to electrical components is provided. The fixture provides a very strong connection to the printed circuit board because the connection therebetween is mechanical. The mechanical connection reduces the tendency of the cable leading to pull the fixture away from the circuit board because the cable leading may have hundreds of wires and thus is relatively heavy. The rotational isolating means prevents torque from being applied to the end of the cylinder rod where the cylinder is rotated. Thus where the fixture is applied to the circuit board, the fixture is initially anchored to the board via the threaded portion of the rod and the circuit board is then urged against the base or pins disposed in the base by rotating the cylinder. However, the isolating means prevents excess torque from being applied to the threaded end of the rod thus preventing the rod from tearing off of the anchor to the printed circuit board.

A fixture embodying the invention also allows the test fixture to be placed close to other test fixtures on the same printed circuit board because there is a very small border between the outer rows of the test pins and the edge of the fixture base.

BRIEF DESCRIPTION OF THE DRAWINGS

The novel features believed characteristic of the invention are set forth in the appended claims. The invention itself, however, as well as other features and advantages there of, will be best understood by reference to the detailed description of specific embodiments which follows, when read in conjunction with the accompany drawings, wherein:

DESCRIPTION OF PREFERRED EMBODIMENTS

Figure 2:
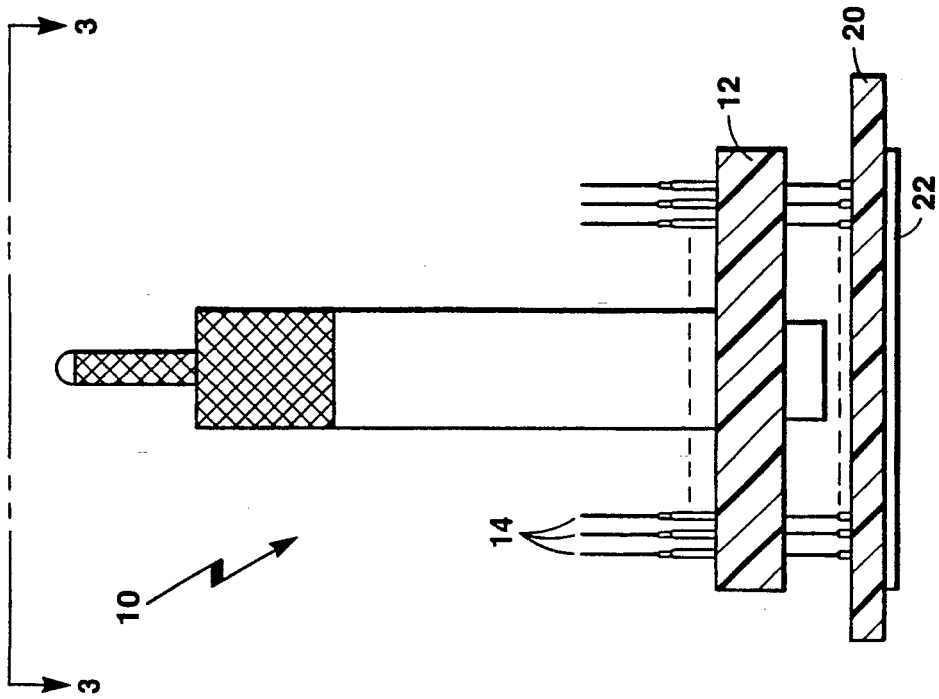
FIG. 2 is a cross sectional view along line 2—2 of FIG. 1 showing the test fixture disposed over a printed circuit board.
Figure 1:
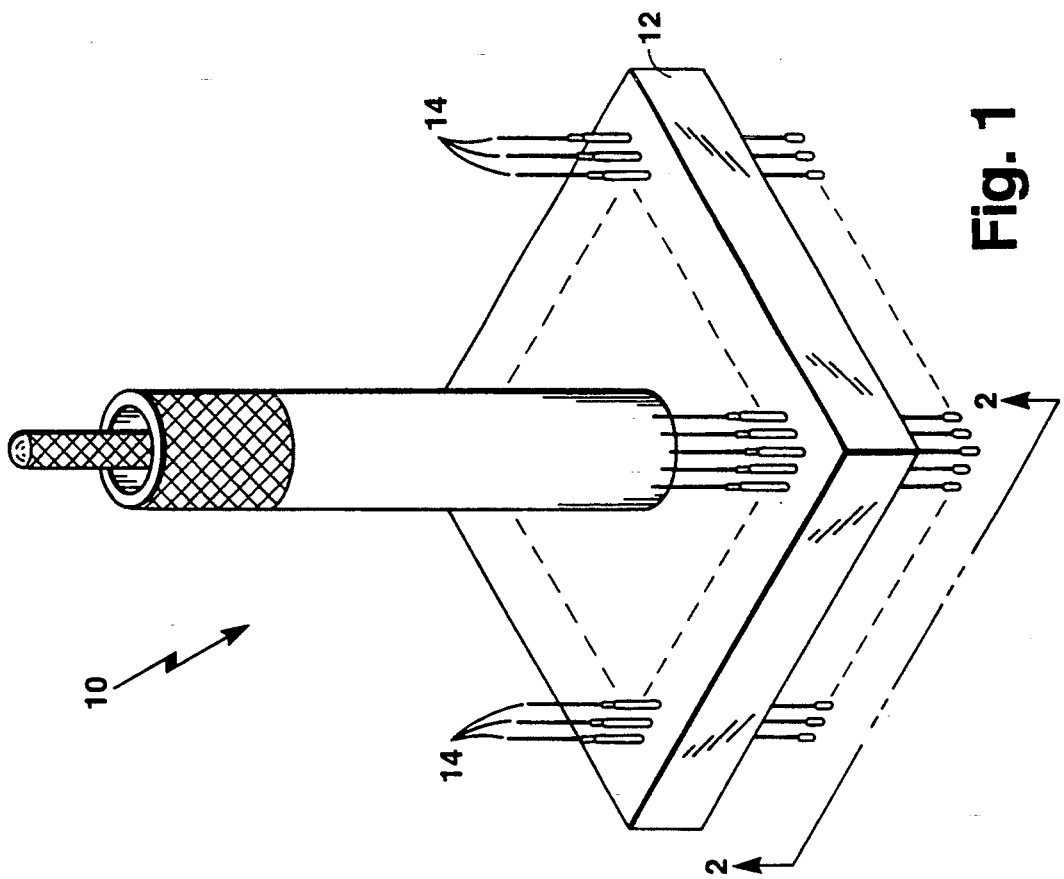
FIG. 1 is an isometric view of a test fixture in accordance with the present invention.

Referring now to FIGS. 1 and 2, a fixture 10 for connecting spring loaded test pins to a multi-pin electronic component or dispersion via patterns is shown to include a base 12 for holding a plurality of test pins 14 as shown. The base 12 can be made from any nonconductive material which is reasonably rigid. The rigidness of the material is selected in order to maintain the relative position of the pins 14 on base 12. It is preferred to form the base 12 from a high-density plastic material. It is also preferred that the plastic material is optically transparent. A preferred example of such plastic material is a polycarbonate plastic such as LEXAN brand plastic (General Electric). It is preferred to be a clear plastic material to assist in alignment of the fixture 10 to an electronic component 22 supported on a printed circuit board 20 (FIG. 2).

Figure 3:
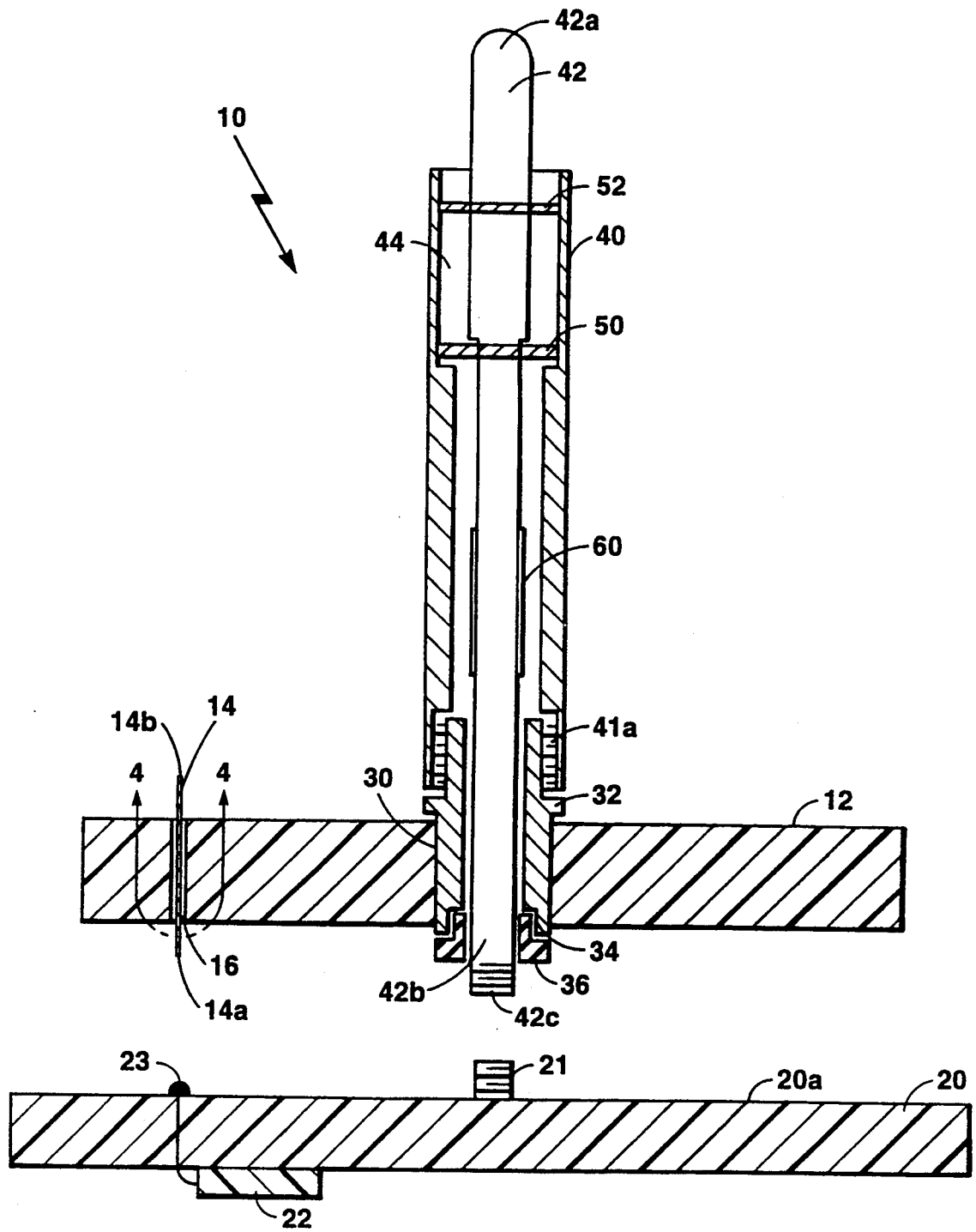
FIG. 3 is a cross sectional view along line 3—3 of FIG. 2.

Referring to FIG. 3, base 12 is shown having a central bore 30 disposed therethrough. Attached through the center bore 30 of the base 12 is a threaded fitting 32. The threaded fitting 32 mates the cylindrical body 40 to the base 12. Alternatively, aperture 30 in base 12 may be threaded to receive a corresponding threaded portion of the cylindrical body 40. The threaded fitting 32 is affixed within the center bore 30 of base 12 using epoxy or any other suitable adhesive. The fitting 32 has a recess 34 arranged on a bottom surface of the base 12, thus acting as a receptacle for a depth stop member 36 for the fixture 10. Depth stop member 36 is an interchangeable, removable, customizeable part preferably made of nonconductive material. The base 12 further has a plurality of apertures 16 therethrough. Test pins 14 are disposed through the apertures or bores 16 in the base 12 and have a first portion 14a protruding through a lower portion of the base 12 and a second portion 14b protruding through an upper portion of the base 12.

The fixture 10 further includes a cylindrical body 40. Disposed through the cylindrical body 40 is a central cylindrical rod 42. Rod 42 is slidably disposed through the cylindrical body 40 so that rod 42 has a first portion 42a protruding from an upper portion of cylindrical body 40 and a second portion 42b disposed through a bottom of base 12 as shown.

The cylindrical body 40 has a central hollow region 44 throughout and has a threaded portion 41a at one end thereof, for connection to the fitting 32. The area above the threaded portion 41a has a slightly smaller inner diameter so as to support a bearing 50 or other rotation isolating means. This cylindrical body 40 is made of a material such as aluminum or stainless steel. Within, and near the top of, the central hollow region 44 is disposed the bearing 50 and a circlip 52. This bearing 50 can be made of material such as metal or polytetrafluoroethylene resin. The circlip 52 is used to retain the bearing 50 within the cylinder 40 so that rod 42 can slide through the bearing 50 but the bearing 50 is retained within the cylinder 40.

The rod 42 is disposed through region 44 and through the center of the bearing 50 and circlip 52. At a bottom end of rod 42, is provided a hollow portion 42c to provide anchoring or attachment of the rod 42 to a set post 21 on the printed circuit board 20 over component 22 to be tested. Preferably, the hollow portion 42c has a threaded portion on the interior thereof with the threads corresponding to mate with threads in the set post 21. Preferably still, the type or direction of threads on the rod and set post are opposite to the type of threads on the cylinder 40 and fitting 32. That is, rod 42 will have one of either left hand threads or right hand threads and the threaded portion of cylinder 40 will have the other opposite type of threads. An alternative arrangement is to provide a hole (not shown) in the printed circuit board 20 with threads to mate with a set of male threads (not shown) on the end of the rod 42. Alternatively, a smooth hole (not shown) can be used to provide an anchor for a hooking device or an expanding mandrel (not shown).

A lower length of rod 42 has a slightly smaller diameter than an upper portion of the rod 42 to provide a region over which a plastic sleeve 60 is disposed. The plastic sleeve 60 prevents the rod 42 from being easily removed through the top portion of the bearing 50 and the cylinder 40.

As shown in particular in FIG. 3, the fixture 10 is disposed over the back surface 20a of a printed circuit board 20. The rod 42 having the threaded portion 42c, when turned, screws onto set post 21 affixing the fixture 10 onto the printed circuit board 20. The cylinder 40 is then rotated in a manner opposed to the rotation of rod 42 thereby compressing the lower part 14a of the test pins 14 against the printed circuit board 20 and hence against component leads or dispersion vias 23 used to connect the components 22 to the board 20. The portion of the cylinder 40 that presses the fixture 10 against the printed wiring board 20 and that attaches to and pulls upon the threaded stud 21 is rotationally isolated by the bearing 50 from the rod 42. Since rod 42 is prevented from sliding out of cylinder 40, rotating cylinder 40 draws down base 12 to printed circuit board 20 through printed circuit board's 20 attachment to printed circuit board stud 21. Therefore, no torque is exerted on the threaded stud 21 in the printed circuit board 20 when the fixture 10 is pressed against the printed circuit board 20 as the cylinder 40 is rotated, thus preventing damage or wear on the printed circuit board stud 21, or misalignment of fixture 10 in relation to component leads or dispersion vias 23.

Since the connection to the printed circuit board 20 is a mechanical one, it is very strong. This is important because cable leading (not shown) typically provided to the fixture 10 and connecting to the top part of the test pins 14 is generally heavy since it may have hundreds of wires. The mechanical connection assists in preventing the fixture 10 from falling off the printed circuit board 20 due to the weight of the cabling (not shown).

Further, the fixture 10 can be built with a perimeter substantially equal to a corresponding perimeter of the component which is to be tested. That is, a small border is disposed between the outer rows of test pins 14 and the edge of the base 12. This is important because it allows the test fixture 10 to be placed close to other test fixtures or components (not shown), as would be the case when probing or testing multiple components on a densely populated printed circuit board 20. Use of this test fixture mitigates the need for changes in circuit board layout to accommodate spacing requirements between test fixtures.

Figure 4:
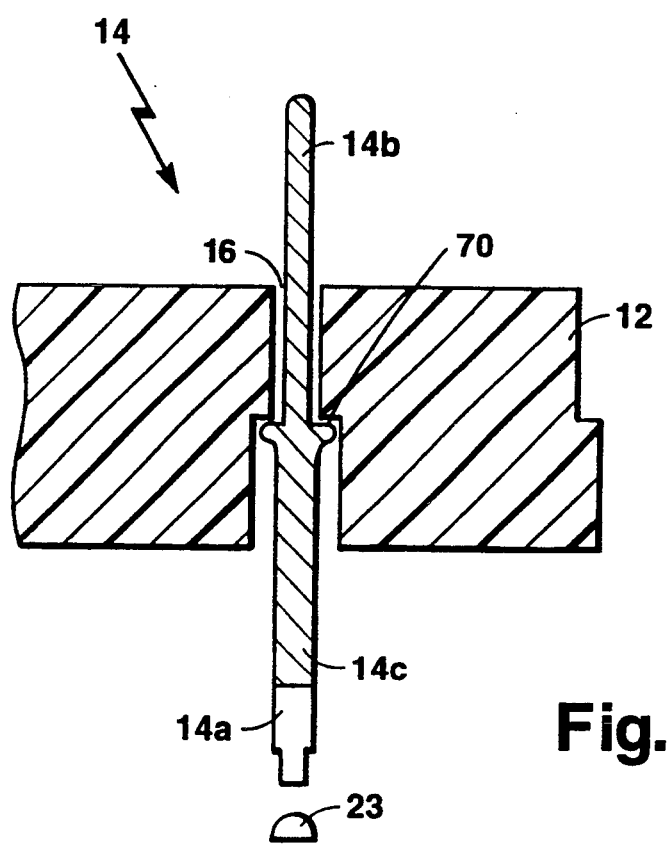
FIG. 4 is an enlarged, exploded, cross section view of a portion of FIG. 3, labeled along line 4—4 of FIG. 4.

Referring now to FIG. 4, the hole 16 in the base 12 where the test pins 14 are inserted is shown as being counterbored. By counter boring the holes 16, less press fit interference between the test pin 14 and the base 12 is needed to hold the pin 14 in place because the counterbored hole 16 prevents the pins 14 from being pushed through. The very small press fit needed reduces the distortion of the base 12 because pressure from test pin 14 contacting with the walls of the base 12 is small. Mechanical pressure on the base ridge 70 counteracts the force needed to securely press pin 14 against the component leads or dispersion vias 23. Such an arrangement also allows accurate alignment of the test pin 14a with the component or dispersion via 23. Here the pin 14 is shown to include a test pin lead portion 14b for connection of a test wire; the test lead portion 14b which is connected to a central sleeve portion 14c provided through the center bored hole 16. Spring loaded test pins 14a with variously shaped tips are disposed through the bottom portion of the sleeve 14c.

Having described a preferred embodiment of the invention, it will now become apparent, to one of skill in the art that other embodiments incorporating its concepts may be used. It is felt therefore, that this embodiment should not be limited to the disclosed embodiment, but rather should be limited only by the spirit and scope of the appended claims.

What is claimed:

1. A fixture for connecting test pins to an electronic component board, comprising:
    a base having a center bore;
    a threaded fitting attached to the base and having a portion disposed through the center bore;
    a cylindrical body having a central bore therethrough and having an internal threaded portion at its lower end mated to the threaded portion of the fitting;
    a cylindrical rod disposed through the cylindrical body; and
    means, disposed through the central bore of the cylindrical body, for providing rotational movement isolation between the cylindrical body and the cylindrical rod.

2. The fixture according to claim 1 wherein the fixture further includes means for retaining within the cylindrical body the means for providing rotational isolation.

3. The fixture according to claim 2 wherein the retaining means includes a circlip attached to an upper portion of the cylindrical body above the means for providing rotational isolation and a sleeve mounted around a lower portion of the cylindrical rod.

4. The fixture according to claim 1 further comprising means disposed on the lower portion of the rod for connecting the rod to a set post on an electronic component board.

5. The fixture according to claim 4 wherein the attachment means on the lower portion of the rod is a threaded type.

6. The fixture according to claim 5 wherein the threads of the set post and cylindrical rod are opposite to that of the cylindrical body and threaded fitting.

7. The fixture according to claim 1 wherein the base has a plurality of holes disposed therethrough and wherein the fixture further comprises a plurality of test pins disposed through the corresponding plurality of holes.

8. The fixture according to claim 7 wherein each one of the plurality of holes are counterbored.

9. The fixture according to claim 1 wherein the base is comprised of a non-conductive, rigid material.

10. The fixture according to claim 9 wherein the non-conductive material is a clear static dissipative polycarbonate.

11. The fixture according to claim 1 wherein the isolating means is a bearing.

12. The fixture to claim 11 wherein the bearing is comprised of metal.

13. The fixture to claim 11 wherein the bearing is comprised of plastic resin.

14. The fixture according to claim 1 wherein the threaded fitting is affixed to the base with epoxy.

15. An arrangement comprising:
    a circuit board;
    a base having a center bore;
    a threaded fitting attached to the base and having a portion disposed through the center bore;
    a cylindrical body having a central bore therethrough and having an internal threaded portion at its lower end mated to the threaded portion of the fitting;
    a cylindrical rod disposed through the cylindrical body;
    means, disposed through the central bore of the cylindrical body, for providing rotational movement isolation between the cylindrical body and the cylindrical rod; and
    means disposed on the board and the rod for attaching the rod to the circuit board.

* * * * *